(12) United States Patent
Rueggen et al.

(10) Patent No.: US 7,648,403 B2
(45) Date of Patent: Jan. 19, 2010

(54) ELECTRICAL PRINTED CIRCUIT BOARD WITH A SCREWLESS TERMINAL CONNECTION

(75) Inventors: Christian Rueggen, Bochum (DE); Herwig Rilling, Kamen (DE)

(73) Assignee: Kostal Industrie Elektrik GmbH, Luedenscheid (DE)

( * ) Notice: Subject to any disclaimer, the term of this patent is extended or adjusted under 35 U.S.C. 154(b) by 0 days.

(21) Appl. No.: 12/425,555

(22) Filed: Apr. 17, 2009

(65) Prior Publication Data

US 2009/0215292 A1  Aug. 27, 2009

Related U.S. Application Data

(63) Continuation of application No. PCT/EP2007/062813, filed on Nov. 26, 2007.

(30) Foreign Application Priority Data

Nov. 27, 2006  (DE) .................. 10 2006 056 259

(51) Int. Cl.
*H01R 4/48* (2006.01)
(52) U.S. Cl. ..................... 439/828; 439/829
(58) Field of Classification Search .......... 439/828, 439/829, 835, 789, 55, 83
See application file for complete search history.

(56) References Cited

U.S. PATENT DOCUMENTS

| 3,079,578 | A | | 2/1963 | Swengel | |
| 3,989,332 | A | * | 11/1976 | Patterson et al. | 439/55 |
| 4,171,861 | A | * | 10/1979 | Hohorst | 439/94 |
| 5,679,021 | A | * | 10/1997 | Kramer | 439/835 |
| 5,860,837 | A | * | 1/1999 | Bock et al. | 439/828 |
| 6,126,494 | A | * | 10/2000 | Fuchs et al. | 439/835 |
| 7,134,883 | B2 | | 11/2006 | Werner et al. | |
| 7,485,015 | B2 | * | 2/2009 | Coffy | 439/828 |
| 7,510,448 | B2 | * | 3/2009 | Eppe et al. | 439/835 |
| 2005/0054219 | A1 | | 3/2005 | Werner et al. | |

FOREIGN PATENT DOCUMENTS

| DE | 38 17 706 | 12/1988 |
| DE | 43 24 917 | 2/1994 |
| DE | 101 53 170 | 2/2003 |
| DE | 103 51 677 | 6/2005 |
| EP | 0 743 705 | 11/1996 |

* cited by examiner

*Primary Examiner*—Michael C Zarroli
(74) *Attorney, Agent, or Firm*—Brooks Kushman P.C.

(57) ABSTRACT

A printed circuit board (PCB) assembly includes a PCB and a screwless terminal connection having a conductor rail and a clamping spring. The PCB has a recess on an edge. The conductor rail has a base part soldered to the PCB and bridging the PCB recess. The base part includes an end extending past the PCB edge. The clamping spring includes three spring legs. The first leg contacts the base part and is between the base part and the PCB recess. The first leg includes an end extending past the PCB edge and contacting the end of the base part. The second leg extends from the first leg through the PCB recess and is beneath the PCB. The third leg includes a clamping aperture and extends upward from the second leg above the PCB. The ends of the base part and the first leg extend through the clamping aperture.

17 Claims, 3 Drawing Sheets

ELECTRICAL PRINTED CIRCUIT BOARD WITH A SCREWLESS TERMINAL CONNECTION

CROSS-REFERENCE TO RELATED APPLICATIONS

This application is a continuation of International Application PCT/EP2007/062813, published in German, with an international filing date of Nov. 26, 2007, which claims priority to DE 10 2006 056 259.3, filed Nov. 27, 2006; the disclosures of which are both hereby incorporated by reference.

BACKGROUND OF THE INVENTION

1. Field of the Invention

The present invention relates to a printed circuit board (PCB) having a screwless terminal connection in which the terminal connection includes a conductor rail soldered to the PCB and a clamping spring fixed to the conductor rail.

2. Background Art

A printed circuit board (PCB) serves to connect flexible conductors with one another and with electrical components. It is desired that a PCB assures secure electrical connections by uncomplicated handling procedures. To this end, a PCB may have a terminal connection which makes contact with a conductor inserted into the terminal connection and with an output lead leading to an electrical component. For instance, a PCB of this type is used in a socket for solar cell modules wherein terminal connections of the PCB make contact with terminal leads of the solar cell modules, which are usually formed as flat cables, and make contact with output leads leading to an electrical component such as an AC converter.

SUMMARY OF THE INVENTION

An object of the present invention is an electrical printed circuit board (PCB) having a relatively high mechanically robust design, and thereby being suitable for rough operating conditions, while at the same time having a relatively low manufacturing cost.

In carrying out the above object and other objects, the present invention provides a printed circuit board (PCB) assembly. The assembly includes a PCB and a screwless terminal connection. The PCB has top and bottom surfaces. The PCB further has a recess on an edge of the PCB. The top surface of the PCB has a pair of terminal strip conductors extending laterally from the edge of the PCB on opposite sides of the recess. The screwless terminal connection has a conductor rail and a clamping spring. The conductor rail includes a triangular contour including a base part, a first side part, and a second side part. The first side part is connected to the base part and the second side part is connected to the first side part. The clamping spring includes first, second, and third spring legs. The first spring leg is connected to the second spring leg and the second spring leg is connected to the third spring leg. The conductor rail is mounted to the top surface of the PCB with the base part of the conductor rail bridging the recess and being soldered to the terminal strip conductors on the top surface of the PCB. The clamping spring is fixed to the conductor rail with the first spring leg contacting the base part of the conductor rail and the second spring leg extending through the recess of the PCB beneath the lower surface of the PCB.

A printed circuit board (PCB) assembly in accordance with embodiments of the present invention includes a PCB and a screwless terminal connection. The PCB has upper and lower surfaces. The PCB includes a recess on an edge of the PCB. The screwless terminal connection includes a conductor rail and a clamping spring. The conductor rail includes a base part which is soldered to the upper surface of the PCB and bridges the PCB recess. The conductor rail base part includes an end portion which extends past the edge of the PCB. The clamping spring includes first, second, and third spring legs. The first spring leg contacts the conductor rail base part and is between the conductor rail base part and the PCB recess. The first spring leg also includes an end portion which extends past the edge of the PCB and contacts the end portion of the conductor rail base part. As such, the end portion of the spring leg is beneath the end portion of the conductor rail base part. The second spring leg extends from the first spring leg through the PCB recess and is beneath the lower surface of the PCB. The third spring leg includes a clamping aperture and extends upward from the second spring leg past the upper surface of the PCB. The end portions of the conductor rail base part and the first spring leg extend through the clamping aperture of the third spring leg. In this normal position, the clamping spring is held at the conductor rail by the end portion of the conductor rail base part being clamped between an upper edge of the clamping aperture of the third spring leg and the end portion of the first spring leg. The third spring leg is movable upward upon a sufficient force to disengage from the end portion of the conductor rail base part. In this opened position of the clamping spring, a conductor can be introduced above the end portion of the conductor rail base part and through the clamping aperture of the third spring leg to contact the conductor rail base part. Subsequently, the clamping spring can be returned to the normal position such that the conductor is clamped between the upper edge of the clamping aperture of the third spring leg and the end portion of the conductor rail base part.

The PCB assembly has a robust design in which the conductor rail may also serve as a counter-bearing for prying open the clamping spring with a lever tool such as a screwdriver. As a result, in a PCB having a plurality of the screwless terminal connections next to one another, the clamping springs can be opened simultaneously. Handling equipment that is rigidly attached to the respective clamping springs can thereby be dispensed.

When the clamping spring of the screwless terminal connection is opened, a solar connector line having a large conductor cross-sections, as well as a flat ribbon conductor having a significant width (common in the solar industry) can be inserted into the terminal connection and then be clamped after removal of the tool.

In an improvement adapted for use in a solar connection box, an extremely efficient cooling surface is available through a large area copper lamination of the PCB surface, which releases the resulting heat to the environment in this case, especially the heat produced by the power loss occurring in bypass diodes of the solar connection box.

The above features, and other features and advantages of the present invention as readily apparent from the following detailed descriptions thereof when taken in connection with the accompanying drawings.

DETAILED DESCRIPTION OF THE PREFERRED EMBODIMENT(S)

Figure 1:
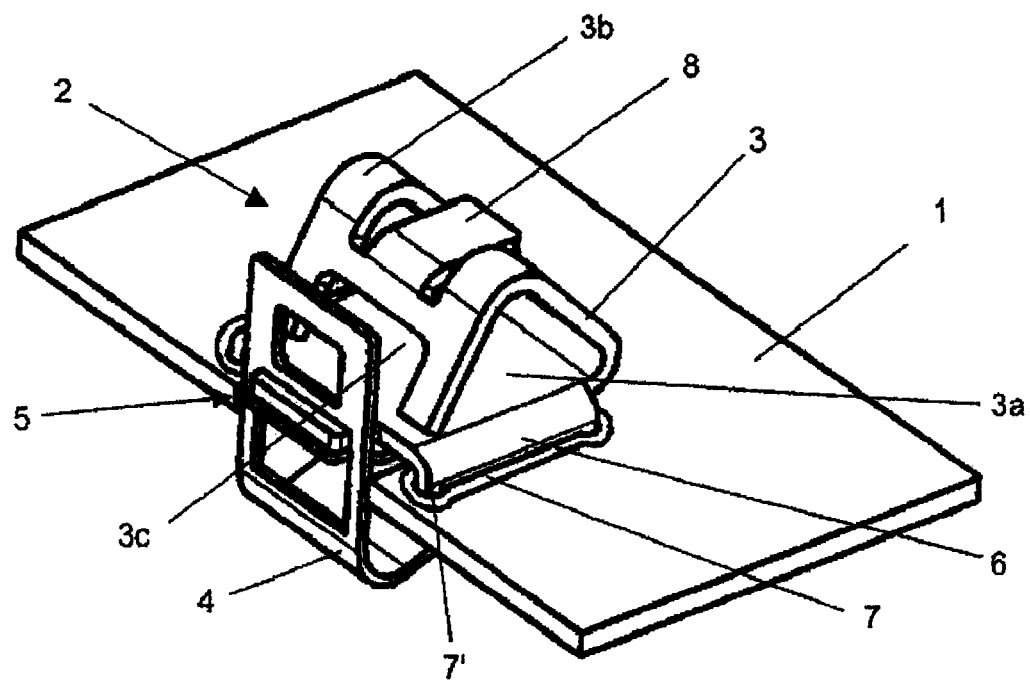
FIG. 1 illustrates a perspective view of a printed circuit board (PCB) assembly having a PCB with a screwless terminal connection in accordance with an embodiment of the present invention.
Figure 2:
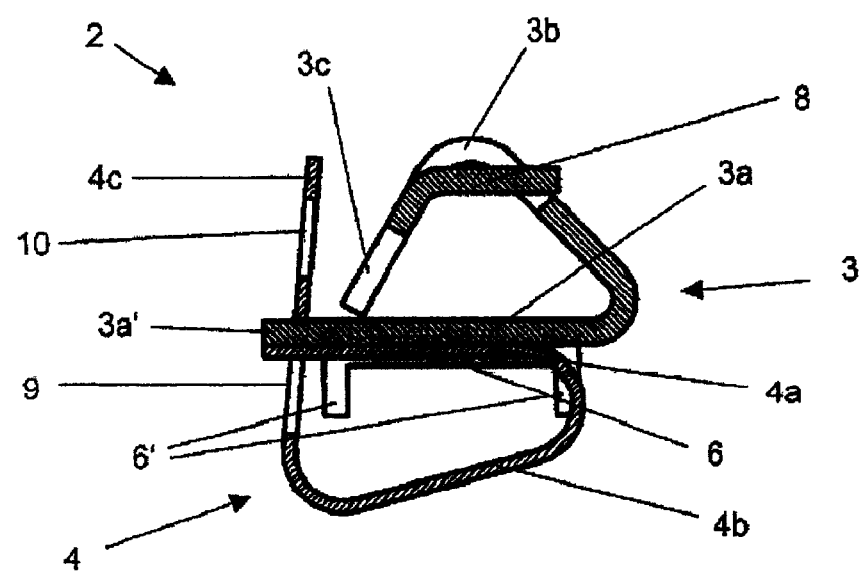
FIG. 2 illustrates a cross-sectional view of the screwless terminal connection of the printed circuit board.
Figure 3:
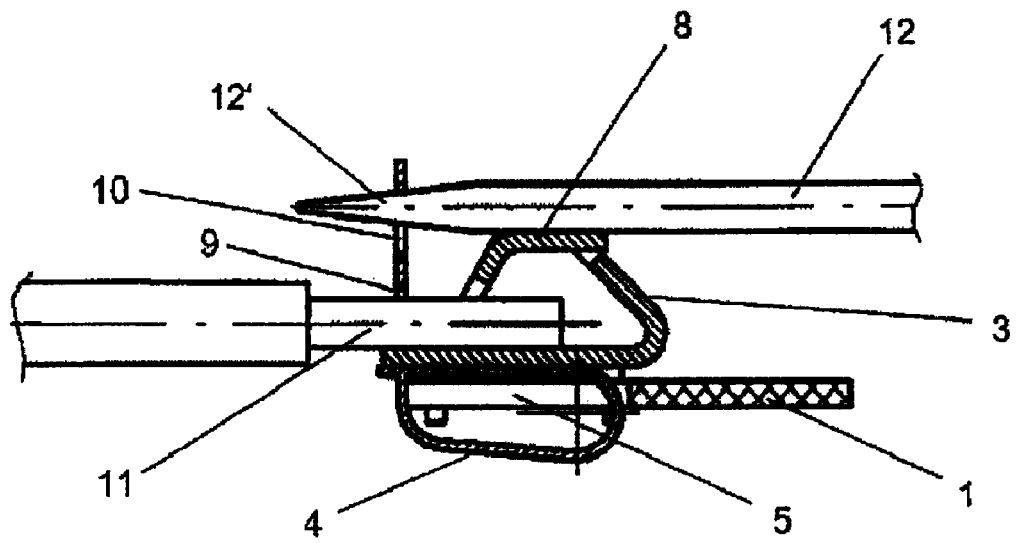
FIG. 3 illustrates a cross-sectional view of the printed circuit board in the region of the screwless terminal connection upon introduction of a conductor into the terminal connection for connection with the terminal connection.

Referring now to FIGS. 1, 2, and 3, a printed circuit board (PCB) assembly having a PCB 1 with a screwless terminal connection 2 in accordance with an embodiment of the present invention will be described.

PCB 1 includes a rectangular recess 5 along an edge. Terminal connection 2 is mounted to PCB 1 at the position of edge recess 5. Terminal connection 2 includes a conductor rail 3 and a clamping spring 4. In general, conductor rail 3 is soldered with terminal strip conductors to PCB 1 and clamping spring 4 is fixed to conductor rail 3.

Conductor rail 3 is fabricated as a punched bent component from an electrically conductive sheet metal material. Conductor rail 3 includes a base part 3a which is arranged parallel to the top surface of PCB 1 and bridges edge recess 5 of PCB. Opposite sides of base part 3a extending past lateral sides of edge recess 5 are folded by 90° to form a pair of slanted plates 6 on the top surface of PCB 1 along the lateral sides of edge recess 5. Each plate 6 of conductor rail 3 includes connecting legs 6' on their front (i.e., closest to the edge of PCB 1) and rear ends. A pair of large area soldering pads 7 formed by parts of the terminal strip conductors of PCB 1 are arranged on the top surface of PCB 1 along the lateral sides of edge recess 5. Each soldering pad 7 includes a pair of suitably positioned front and rear holes 7' extending between the top and bottom surfaces of PCB 1 for receiving connecting legs 6' of conductor rail 3.

Connecting legs 6' of conductor rail 3 thereby extend far enough into holes 7' such that the lower edges of plates 6 engage against soldering pads 7 on the top surface of PCB 1. Soldering pads 7 are coated with a reflux soldering paste prior to conductor rail 3 being mounted to PCB 1. During fabrication of PCB 1 in a reflux furnace, the soldering paste forms the solder connection between plates 6 of conductor rail 3 and the terminal strip conductors of PCB 1. A stable mechanical connection is assured by the large-area solder connection, as well as the penetration of connecting legs 6' through holes 7' in PCB 1, which also withstands large stresses.

As shown in FIG. 2, particularly in the longitudinal section through terminal connection 2, conductor rail 3 has an approximately triangular contour in the longitudinal section by two bends of its sheet metal, first through about 135° and then through about 90°, in the region adjacent to base part 3a the same as in its rear, i.e., the edge of PCB 1. The end of the sheet metal that is bent backwards from above onto the front edge of base part 3a includes a recess 3c in its middle. As shown in FIG. 3, a conductor 11 to be contacted is introduced through recess 3c into terminal connection 2. A strap is cut away in the middle of the sheet metal in the region of upper edge 3b of the triangular contour of conductor rail 3 to form a tongue 8. Tongue 8 extends from the bent end having recess 3c away from the edge of PCB 1 parallel to base part 3a.

Clamping spring 4 is fabricated as a punched bent component from a sheet metal strap made of a material having elastic deformability, i.e., a material having spring properties. To this end, clamping spring 4 includes three longitudinal regions that are connected by two bending regions. The three longitudinal regions include a first spring leg 4a, a second spring leg 4b, and a third spring leg 4c. Second spring leg 4b is connected at one end to first spring leg 4a through a bending region that approximately describes a semicircle. Second spring leg 4b is connected at its other end to third spring leg 4c through a bending region that approximately describes a quarter circle.

Third spring leg 4c of clamping spring 4 includes first and second rectangular apertures 9, 10 in its surface. First aperture 9 is larger than second aperture 10. First aperture 9 lies closest to the bend between second and third spring legs 4b, 4c and thereby serves as a clamping aperture 9. The terminal end of a conductor 11 to be connected to terminal connection 2 is introduced through clamping aperture 9. Conductor 11 is then retained to terminal connection 2 by being clamped in by an upper edge 9' of clamping aperture 9. Second aperture 10 serves as an actuation aperture 10 through which a lever tool 10 is introduced to open terminal connection 2 and thereby release conductor 11 from being clamped by upper edge 9' of clamping aperture 9.

First spring leg 4a of clamping spring 4 has a sufficient length such that in its initial state its end extends through clamping aperture 9 of third spring leg 4c. Clamping spring 4 undergoes a certain amount of pretension even in the initial state.

Clamping spring 4 is fastened to conductor rail 3 such that first spring leg 4a abuts flat against base part 3a of conductor rail 3 on its lower side. Second spring leg 4b extends obliquely through recess 5 of PCB 1 in a downward direction to the edge region of PCB 1. Third spring leg 4c extends approximately perpendicular to PCB 1 along the edge of PCB 1. Clamping spring 4 is held at conductor rail 3 by a front projection 3a' of base part 3a clamped between upper edge 9' of clamping aperture 9 and the end of first spring leg 4a.

As shown in FIG. 3, a tool 12 may be used to open terminal connection 2 in order to introduce a conductor 11 into terminal connection. Tool 12 such as a screwdriver having a blade 12' is introduced from the rear side of terminal connection 2 into actuating aperture 10 of third spring leg 4c of clamping spring 4. Tool 12 uses tongue 8, which extends from the middle of the sheet metal of conductor rail 3 in the region of the upper edge of the triangular contour of conductor rail 3, to act as a lever in order to move third spring leg 4c upwards such that clamping aperture 9 is released to accept conductor 11. Tool 12 is removed from actuating aperture 10 after conductor 11 is inserted through clamping aperture 9. Consequently, conductor 11 is pressed by upper edge 9' of clamping aperture 9 against conductor rail 3 by spring pressure. Conductor 11 is thereby held securely in this position and an electrical contact is made to conductor rail 3.

Figure 4:
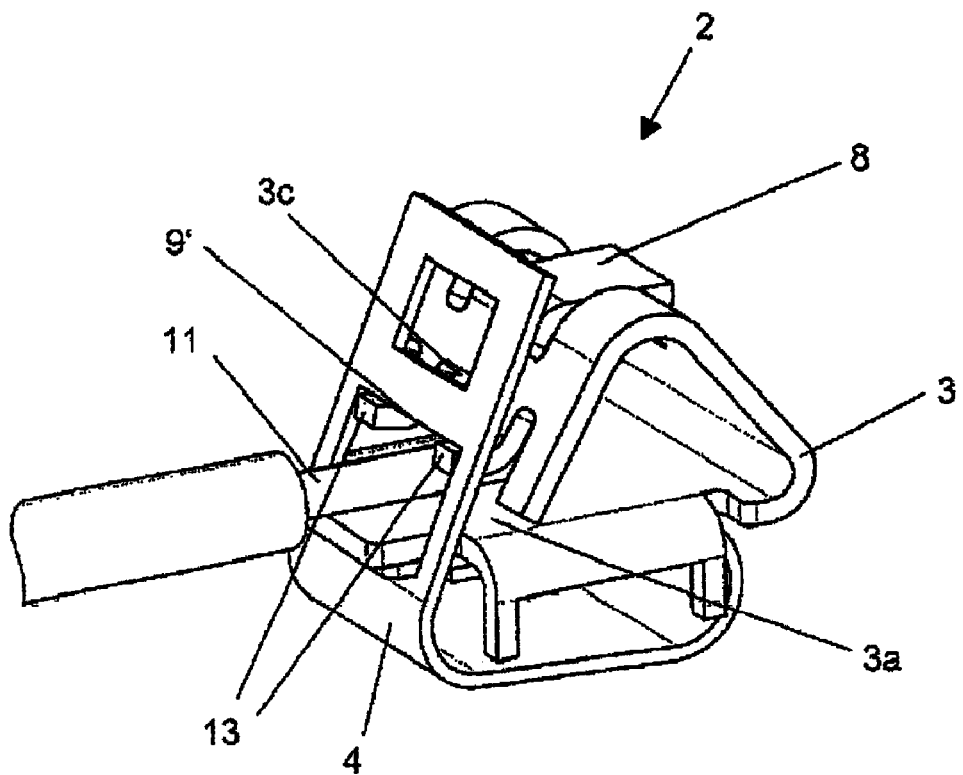
FIG. 4 illustrates a screwless terminal connection of a printed circuit board in accordance with another embodiment of the present invention.

Referring now to FIG. 4, a screwless terminal connection 2 of a PCB 1 in accordance with another embodiment of the present invention is shown. Conductor rail 3 of this terminal connection 2 includes two alignment clamps 13. Alignment clamps 13 are slanted to the edge of PCB 1 from the end of the sheet metal part that is bent backwards on both sides of recess 3c from above onto the front edge of base part 3a through which conductor 11 to be connected to terminal connection 2 is introduced. Alignment clamps 13 are oriented essentially parallel to base part 3a of conductor rail 3 and are thereby arranged above and to the side of the region used for introducing conductor 11. Alignment clamps 13 enable a fixing of clamping spring 4 in the position that is opened to introduce conductor 11. As a result, the previously described opening procedure of terminal connection 2 by tool 12 can already take place in a preliminary step prior to the mounting of conductor 11 on PCB 1 as clamping aperture 9 is pulled toward the rear with its upper edge 9' above alignment clamps 13. After introduction of conductor 11, only clamping spring 4 must then be released again, which is accomplished by a slight forward pressure against the upper region of clamping spring 4.

Figure 5:
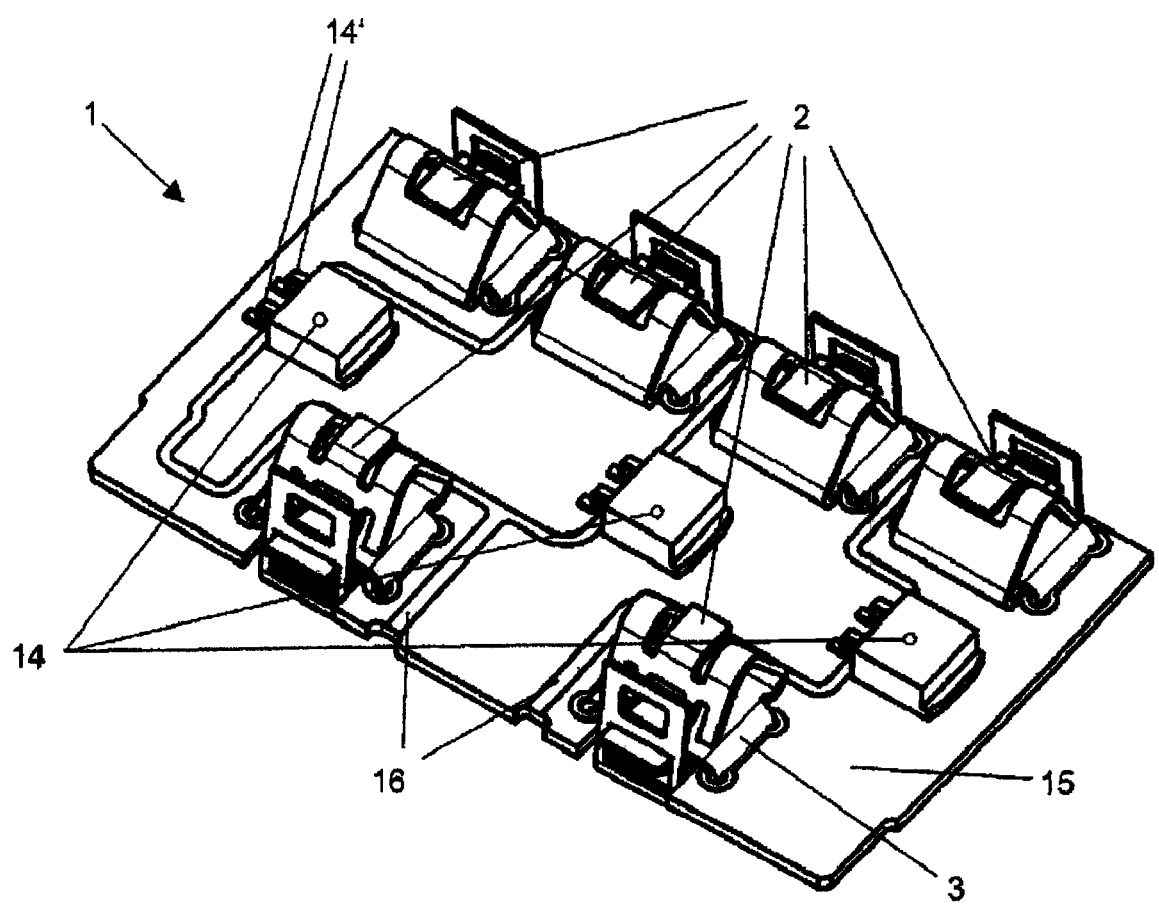
FIG. 5 illustrates a printed circuit board (PCB) assembly having a PCB with a plurality of screwless terminal connections in accordance with an embodiment of the present invention.

Referring now to FIG. 5, a PCB 1 having a plurality of screwless terminal connections 2 in accordance with an embodiment of the present invention is shown. In particular, PCB 1 shown in FIG. 5 includes six terminal connections 2 and three semiconductor components. This PCB 1 represents a terminal box for solar cell modules. The semiconductor components are so-called bypass-diodes 14. Diodes 14 are respectively connected in parallel to a solar cell module having a plurality of solar cells in the blocking direction. Diodes 14 are mounted on PCB 1 as SMD components, and are soldered to PCB 1 in the same reflux soldering process as conductor rails 3. One of the contacts of diodes 14 is thereby formed by the legs visible in the drawing, and the other contact is located on the non-visible underside of the component.

When one or more of the solar cell modules is shaded, i.e., due to a significant local reduction of the light beams incident on single solar cells, as for example by dense clouds, the current of the solar cell modules, which is not affected by the shading is normally conducted through diodes 14 provided for protection of the affected solar cell modules. The power loss arising in this manner can become considerable which leads to a corresponding heat buildup.

PCB 1 shown in FIG. 5 has an approximately full-area copper lamination 15 on its upper surface, wherein only narrow paths 16 are removed from copper lamination 15 to separate the different potentials from one another. Copper lamination 15 forms large effective conductor cross-sections and thereby assures a suitably high current carrying ability for the respective circuit. An additional effect of copper lamination 15 is that a great deal of heat can be radiated away from its surface, and it thus serves as a cooling body, together with conductor rails 3 through which the heat developed by the abovementioned power loss of diodes 14 can be given off to the environment.

PCB 1 shown in FIG. 5 is mounted in a specially designed housing (now shown) to construct a terminal box for solar cell modules. The housing can at the same time incorporate reinforcing ribs and the like by using additional elements for increasing the mechanical stability, such as attachment points for PCB 1. In order to actuate terminal connections 2, as well as for removing the excess heat, the housing includes apertures adapted to these needs.

While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. An assembly comprising:
    a printed circuit board having a top surface and a bottom surface, the printed circuit board further having a recess on an edge of the printed circuit board, the top surface of the printed circuit board having a pair of terminal strip conductors extending laterally from the edge of the printed circuit board on opposite sides of the recess; and
    a screwless terminal connection having a conductor rail and a clamping spring;
    the conductor rail including a triangular contour including a base part, a first side part, and a second side part, wherein the first side part is connected to the base part and the second side part is connected to the first side part;
    the clamping spring including a first spring leg, a second spring leg, and a third spring leg, wherein the first spring leg is connected to the second spring leg and the second spring leg is connected to the third spring leg;
    wherein the conductor rail is mounted to the top surface of the printed circuit board with the base part of the conductor rail bridging the recess and being soldered to the terminal strip conductors on the top surface of the printed circuit board;
    wherein the clamping spring is fixed to the conductor rail with the first spring leg of the clamping spring contacting the base part of the conductor rail and the second spring leg of the clamping spring extending through the recess of the printed circuit board beneath the lower surface of the printed circuit board.

2. The assembly of claim 1 wherein:
    the base part of the conductor rail includes connecting legs that dip into corresponding holes on the printed circuit board in order for the base part of the conductor rail to be soldered to the terminal strip conductors on the top surface of the printed circuit board.

3. The assembly of claim 1 wherein:
    the conductor rail is soldered to the terminal strip conductors of the printed circuit board by a reflux-soldered connection.

4. The assembly of claim 3 wherein:
    soldering pads formed by parts of the terminal strip conductors of the printed circuit board are arranged laterally along opposite sides of the recess of the printed circuit board.

5. The assembly of claim 1 wherein:
    the first side part of the conductor rail includes a tongue that extends parallel to the base part of the conductor rail.

6. The assembly of claim 1 wherein:
    the conductor rail includes two alignment clamps.

7. The assembly of claim 6 wherein:
    the conductor rail further includes alignment clamps.

8. The assembly of claim 1 wherein:
    the top surface of the printed circuit board includes a copper lamination, wherein narrow paths are removed from the copper lamination to separate different potentials from one another.

9. The assembly of claim 1 wherein:
    a bypass-diode is connected to the printed circuit board and is in electrical connection with the conductor rail.

10. The assembly of claim 1 wherein:
    the conductor rail is a punched sheet metal component.

11. The assembly of claim 1 wherein:
    the clamping spring is a punched sheet metal component.

12. An assembly comprising:
    a printed circuit board having upper and lower surfaces and a recess on an edge;
    a conductor rail including a base part soldered to the upper surface of the PCB and bridging the PCB recess, the conductor rail base part including an end portion extending past the edge of the PCB; and
    a clamping spring including first, second, and third spring legs, the first spring leg contacting the conductor rail base part and is between the conductor rail base part and the PCB recess, the first spring leg including an end portion extending past the edge of the PCB and contacting the end portion of the conductor rail base part, the second spring leg extending from the first spring leg through the PCB recess and is beneath the lower surface of the PCB, the third spring leg including a clamping aperture and extending upward from the second spring leg above past the upper surface of the PCB;

wherein the end portions of the conductor rail base part and the first spring leg extend through the clamping aperture of the third spring leg.

13. The assembly of claim 12 wherein:

the clamping spring is movable between a clamping position and an opened position, wherein the clamping spring is movable from the clamping position to the opened position upon a sufficient upward force applied to the third spring leg, wherein the clamping spring is biased to be in the clamping position;

wherein in the clamping position the clamping spring is held at the conductor rail by the end portion of the conductor rail base part being clamped between an upper edge of the clamping aperture of the third spring leg and the end portion of the first spring leg;

wherein in the opened position the upper edge of the clamping aperture of the third spring leg disengages from the end portion of the conductor rail base part such that a clearance space is between the upper edge of the clamping aperture of the third spring leg and the end portion of the conductor rail base part whereby a conductor can be introduced through the clamping aperture of the third spring leg to contact the conductor rail base part.

14. The assembly of claim 13 wherein:

in the clamping position, a conductor introduced through the clamping aperture of the third spring leg and contacting the conductor rail base part is clamped between the upper edge of the clamping aperture of the third spring leg and the end portion of the conductor rail base part.

15. The assembly of claim 12 wherein:

the conductor rail has a triangular contour including the base part, a first side part, and a second side part, wherein the first side part is connected to the base part and the second side part is connected to the first side part.

16. The assembly of claim 15 wherein:

the second side part of the conductor rail includes a recess whereby a conductor introduced through the clamping aperture of the third spring leg to contact the conductor rail base part extends through the recess of the second side part of the conductor rail.

17. The assembly of claim 16 wherein:

the third spring leg of the clamping spring includes an actuation aperture positioned above the clamping aperture of the third spring leg;

wherein the first side part of the conductor rail includes a tongue which extends parallel to the conductor rail base part;

wherein the tongue of the first side part of the conductor rail serves as a counter-bearing for a tool extending along the tongue and through the actuation aperture of the third spring leg for the tool to apply a sufficient upward force to the third spring leg in order to move the clamping spring from the clamping position to the opened position.

* * * * *